United States Patent [19] [11] Patent Number: 4,761,612
Holland et al. [45] Date of Patent: Aug. 2, 1988

[54] PROGRAMMABLE EDDY CURRENT CORRECTION

[75] Inventors: G. Neil Holland, Chagrin Falls; John R. Stauber, Fairview Park, both of Ohio

[73] Assignee: Picker International, Inc., Highland Hts., Ohio

[21] Appl. No.: 33,532

[22] Filed: Apr. 3, 1987

Related U.S. Application Data

[63] Continuation-in-part of Ser. No. 758,761, Jul. 25, 1985, Pat. No. 4,703,275.

[51] Int. Cl.[4] ............................................. G01R 33/20
[52] U.S. Cl. ..................................... 324/307; 324/322
[58] Field of Search ................ 324/307, 309, 310, 311, 324/312, 318, 322; 364/414

[56] References Cited

U.S. PATENT DOCUMENTS

| 3,792,345 | 2/1974 | Hawkins et al. | 324/307 |
| 4,005,358 | 1/1977 | Foner | 324/233 |
| 4,300,096 | 11/1981 | Harrison et al. | 324/309 |
| 4,386,318 | 5/1983 | Burbank et al. | 324/244 |
| 4,585,995 | 4/1986 | Flugan | 324/322 |
| 4,670,716 | 6/1987 | Kunz | 324/309 |
| 4,680,547 | 7/1987 | Leue et al. | 324/309 |
| 4,698,591 | 10/1987 | Glover et al. | 324/318 |

FOREIGN PATENT DOCUMENTS

| 0161366 | 11/1985 | European Pat. Off. . |
| 1598998 | 7/1965 | Fed. Rep. of Germany . |
| 8403773 | 9/1984 | PCT Int'l Appl. . |
| 8404173 | 10/1984 | PCT Int'l Appl. . |
| 2053481 | 2/1981 | United Kingdom . |

OTHER PUBLICATIONS

"Noise Pulse Generator for Nuclear Magnetic Resonance (NMR) Measurements of Self Diffusion According to Pulse Gradient Method" by Skirda, et al., Inst. & Exp. Tech., vol. 19, No. 3, (1976).

"Simulator for Video Pulse Signals with Specified Envelope Form" by B. E. Ryshchar, Pribory Tekhnika Eksperimenta, No. 1, pp. 145–148, Jan.–Feb. 1981.

"NMR Imaging: Image Recovery Under Magnetic Fields with Large Non-Uniformities" by Hutchison, et al., The Institute of Physics, 1978, pp. 217–221.

Primary Examiner—Stewart J. Levy
Assistant Examiner—Kevin D. O'Shea
Attorney, Agent, or Firm—Fay, Sharpe, Beall, Fagan, Minnich & McKee

[57] ABSTRACT

In a magnetic resonance imaging apparatus, a gradient profile generator (30) generates gradient energization profiles or current pulses (32, 34, 36) each of which has a shape that corresponds to a profile of a preselected magnetic field gradient that is to be applied across an image region (10) by gradient coils (38). The applied gradient magnetic field profile inherently causes eddy currents which generate opposing magnetic field components and distort the gradient magnetic field profile. A series of calibration circuits (62) alters the gradient energization profiles to compensate for eddy current distortion. A profile amplifier (74) is connected with a first MDAC (80) in parallel with a capacitor (82) and a second MDAC (84) in a feedback loop. By digitally controlling the internal resistance of the MDACs, the magnitude of a feedback signal and its RC time constant are digitally adjusted. A magnetic field sensor (90) measures the resultant gradient magnetic field profile. An iterative adjustment computer (92) compares the measured and preselected gradient magnetic field profiles and iteratively adjusts the MDACs to optimize the conformity therebetween. The calibration circuits are enabled only during a radio frequency transmission or receipt. Between radio frequency transmissions and reception, bypass switches (114, 116) bypass the calibration circuits to conserve electrical power.

19 Claims, 2 Drawing Sheets

PROGRAMMABLE EDDY CURRENT CORRECTION

BACKGROUND OF THE INVENTION

This application is a continuation-in-part of application Ser. No. 758,761, filed July 25, 1985, now U.S. Pat. No. 4,703,275.

The present invention relates to the art of electromagnetic field correction and modification. It finds particular application in conjunction with the maintenance of gradient magnetic field spatial linearity in magnetic resonance imaging and will be described with particular reference thereto. It is to be appreciated, however, that the invention will also find application in conjunction with magnetic resonance spectroscopy and other applications in which electromagnetic field strengths are controlled or their linearity adjusted.

In magnetic resonance imaging and spectroscopy, a uniform magnetic field is created through an examination region in which a subject to be examined is disposed. The magnetization vector of dipoles of the examined subject preferentially aligns with the uniform field. Radio frequency excitation pulses are applied to cause the magnetization vectors of the dipoles to precess about the uniform magnetic field. After the radio frequenct excitation, the precessing magnetization vectors generate radio frequency magnetic resonance signals as the precession decays back toward alignment with the uniform magnetic field. The frequency of the radio frequency signals is proportional to the strength of the magnetic field. Various combinations of radio frequency pulses and magnetic field gradient pulses are applied to manipulate the precessing magnetization vectors to create echo signals from the resonating dipole magnetization.

In magnetic resonance imaging, gradient magnetic fields are applied to select and encode a subregion of the uniform magnetic field and the subject in which the resonating dipoles are to be examined. Magnetic field gradients are applied to select one or more slices or planes which are to be imaged. Other gradient fields selectively modify the uniform magnetic field to encode the frequency and phase of the magnetization vectors of the resonating nuclei in the selected plane.

The gradient fields are conventionally applied as a series of gradient pulses. The duration and timing of the pulses relative to the radio frequency signals is precisely timed for optimal performance. More specifically, electric current pulses of the selected duration, amplitude, shape, and timing are applied to gradient field coils to cause corresponding magnetic field pulses.

One of problems inherent in magnetic fields is that the resultant gradient magnetic field pulses do not match the profile of the electrical potential pulses applied to the gradient field coils. A changing magnetic field induces eddy currents, which eddy currents cause corresponding eddy magnetic fields. Thus, each applied current pulse causes a gradient magnetic field pulse which cause eddy currents that add unwanted eddy component to the induced gradient magnetic field pulse. The effect of the eddy current varies with the amount and conductivity of the material in which the eddy currents are induced, the proximity of this material to the gradient field coil, and the magnitude of the pulsed gradient magnetic field. The metallic structures might include supporting structures of the magnetic support structure, a room temperature bove tube of the magnet, a liquid nitrogen dewar of a superconducting magnet, and other adjacent metallic structures. The variances in the thickness, concentricity, and other construction tolerances from magnet to magnet cause each magnetic resonance system to generate spatially variant eddy currents with different magnitudes and time constants.

In order to improve the imaging quality, the shape of the electric energization pulse is altered such that the magnetic field produced by the sum of the excitation current pulse and the eddy currents approximates the desired gradient magnetic field pulse shape and duration. One such correction circuit is illustrated in U.S. Pat. No. 4,585,995 which issued Apr. 29, 1986 to D. C. Flugan. In this patent, the current pulse passes through a differential amplifier that has one or more analog feedback loops which each add an additional component to the excitation current pulse. Each added current component has an amplitude and exponential decay rate selected to compensate for eddy current effects.

One of the problems with analog feedback loop correction is the difficulty of calibration. Because the eddy currents vary in accordance with the conductive material adjacent the gradient coils, a unique calibration adjustment is required for each installed imager. Further, the gradient coil of a magnetic resonance imager commonly includes a plurality of coils, each of which requires an analogous, manually adjusted feedback loop. Accordingly, numerous calibration adjustments are required. Thus, calibrating the gradient coil pulse correction analog circuitry is a time consuming, difficult, and often imprecise operation.

Another drawback to the manually adjusted systems was that the calibration is frequently not optimized. Because the calibration is labor intensive, the calibration process is often terminated when the magnetic field linearity is brought within predefined specifications rather than when the calibration is optimized.

Another drawback of the analog system is that it is power consumptive. Correcting for eddy currents tends to place an added load of at least 20–30% on the gradient power amplifiers, and often up to 50%. This reduction in gradient power tends to limit minimum slice thickness, the minimum field of view, the gradient duty cycle, and the like.

The present invention provides a new and improved magnetic resonance method and apparatus which overcomes the above referenced drawbacks and others.

SUMMARY OF THE INVENTION

In accordance with one aspect of the present invention, a method of magnetic resonance is provided. Before positioning a subject in an examination region, gradient magnetic fields are automatically calibrated by a computer utilizing an iterative or other adjustment routine. After the magnetic field in the examination region has been automatically calibrated, subjects are selectively placed in the examination region and magnetic resonance data are collected.

In accordance with another aspect of the present invention, a method of magnetic resonance imaging is provided. A subject to be examined is positioned in an examination region. Gradient field excitation profiles are generated, calibrated, and applied to a gradient field coil to cause a corresponding gradient magnetic field. Radio frequency excitation pulses are transmitted into the examination region and resultant radio frequency magnetic resonance signals are received therefrom. The step of calibrating the energization profiles is performed only in conjunction with gradient fields which are applied concurrently with a radio frequency transmission or receipt.

In accordance with another aspect of the present invention, a magnetic resonance apparatus is provided. A gradient coil means is provided for generating gradient magnetic fields in response to a gradient energization profile. A gradient profile generating means is interconnected with the gradient field means for supplying each selected energization profile for causing a resultant gradient field. A gradient profile calibration means compensates for errors in the gradient magnetic field attributable to eddy currents caused by applying the selected energization profile to the gradient coil means altering the selected energization profile. An induced magnetic field means measures the resultant gradient magnetic field. A computer processor means compares the measured gradient magnetic field with a preselected gradient magnetic field profile and iteratively adjusts the profile calibration means until the coincidence between the measured gradient magnetic field and preselected profile is optimized.

In accordance with another aspect of the present invention, the profile calibration means includes a digital potentiometer means for feeding back portions of the calibrated energization profile. The fedback portion of the energization profile is digitally controlled by the computer processor means.

In accordance with another aspect of the present invention, the digital potentiometer means includes a multiplying digital-to-analog converter.

In accordance with yet another aspect of the present invention, a calibration bypass means selectively switches the profile calibration means into and out of communication between the energization profile generating means and the gradient coil means. In this manner, only selected energization profiles are corrected or calibrated. Preferably, the switching means is controlled such that the profile calibration means corrects energization profiles which are applied only during transmission or receipt of radio frequency signals.

One advantage of the present invention is that it improves the precision of gradient magnetic field calibration.

Another advantage of the present invention is that it reduces labor intensity of gradient magnetic field profile calibration.

Still another advantage of the present invention resides in a reduction in load on gradient profile power amplifiers.

Still further advantages of the present invention will become apparent to those of ordinary skill in the art upon reading and understanding the following detailed description of the preferred embodiment.

BRIEF DESCRIPTION OF THE DRAWINGS

The present invention may take form in various parts and arrangements of parts or in various steps and arrangements of steps. The drawings are only for purposes of illustrating a preferred embodiment and are not to be construed as limiting the invention.

DETAILED DESCRIPTION OF THE PREFERRED EMBODIMENT

Figure 1:
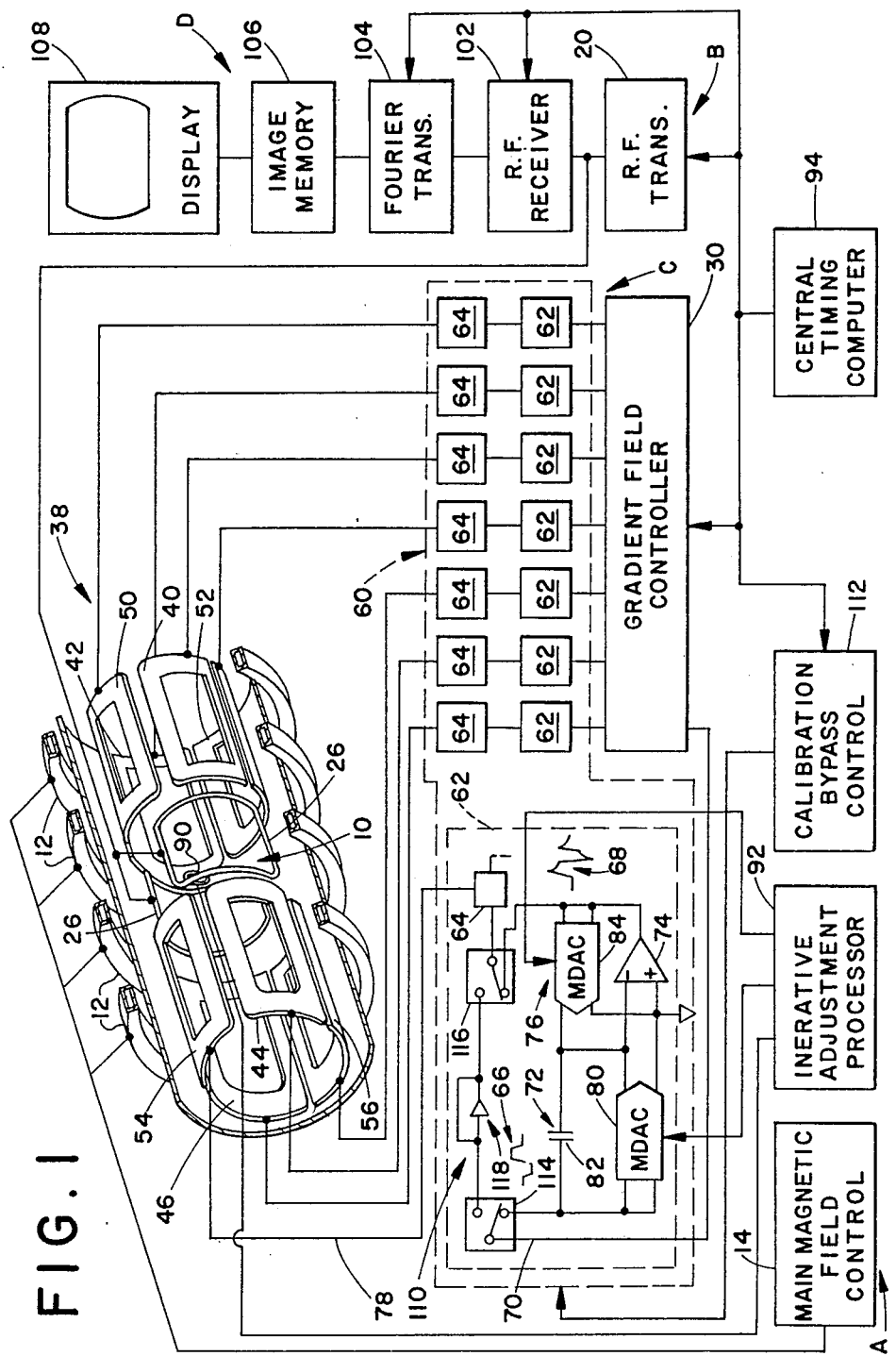
FIG. 1 is a diagrammatic illustration of a magnetic resonance imaging apparatus in accordance with the present invention.

With reference to FIG. 1, a magnetic resonance imaging apparatus includes a main magnetic field means A for generating a substantially uniform magnetic field longitudinally through an examination or image region 10. A main magnetic field means includes a plurality of main field magnets 12 which are operated under the control of a main magnetic field control means and power supply 14. Various electrical and mechanical shimming techniques are provided such that the resultant main magnetic field is linear and uniform through the image region after any distortion caused by surrounding imager hardware, such as the hardware described below.

Figure 2:
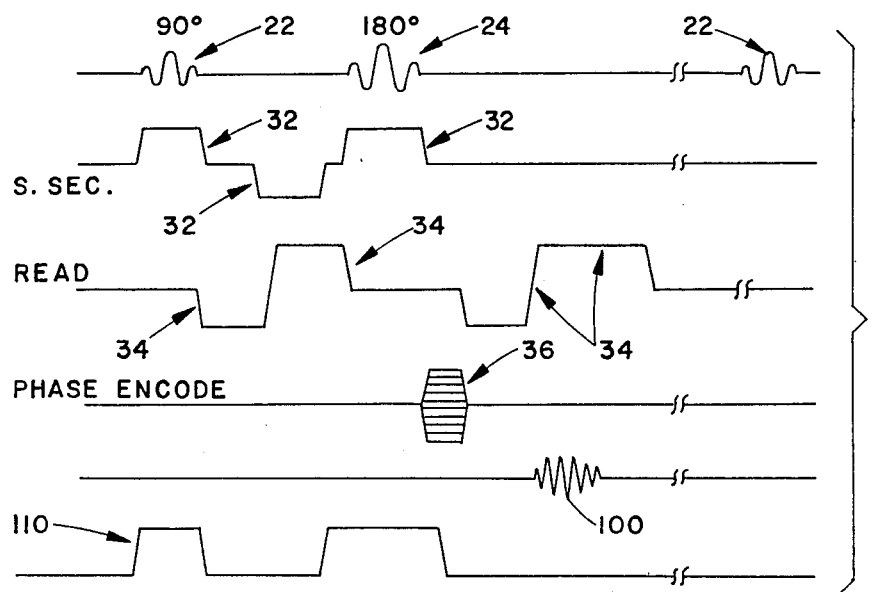
FIG. 2 is a diagrammatic illustration of an exemplary magnetic resonance imaging sequence in accordance with the present invention; and, FIG. 3 is a detailed circuit schematic of a digital gradient energization profile calibration circuit in accordance with the present invention.

With primary reference to FIG. 1 and secondary reference to FIG. 2, a resonance excitation means B includes a radio frequency transmitter 20 for generating a magnetic resonance excitation pulse 22 and other magnetic resonance manipulation pulses 24. A radio frequency antenna 26 is disposed adjacent the image region for transmitting the radio frequency pulses into a patient or other subject in the image region 10.

A gradient field means C selectively applies gradient magnetic fields across the main magnetic field in the image region 10. A gradient energization profile generating means 30 selectively generates gradient field energizing profiles with a preselected timing and duration relative to the radio frequency pulses 22 and 24. Commonly, the gradient energization profiles include slice select gradient energization profiles 32 for selecting a slice or planar region to be imaged. A read gradient energization profile 34 provide frequency encoding along a preselected read axis lying within the selected slice. With each repetition of the sequence, a phase encode gradient energization profile 36 of a different amplitude provides a phase encoding along a phase encode axis, generally perpendicular to the read axis.

The gradient energization profiles, commonly current pulses, are applied by a gradient coil means 38 which includes a plurality of x-axis gradient coils 40, 42, 44, and 46. Commonly, the x-axis coils are mirror images of each other across a perpendicular plane through the image region, across a horizontal plane, and across a vertical plane. A plurality of y-axis gradient coils 50, 52, 54, 56 are normally the same as the x-axis coils but rotated 90° to apply analogous gradients along a y-axis which is defined perpendicular to the x-axis. The slice select gradient is often generated by z gradient coils (not shown). The read and phase encode axes are often selected to coincide with the x and y axes.

The gradient coils convert the current pulses into corresponding gradient magnetic field profiles. However, changing magnetic fields such as the gradient magnetic field profiles induce eddy currents in the surrounding metal structures such as the gradient coils. The eddy currents generate magnetic field components that oppose the gradient magnetic field profiles and decay with time, causing a distortion therein. In this manner, the eddy currents cause the gradient magnetic field profile to differ from a preselected profile.

With continuing reference to FIG. 1 digitally programmable gradient profile calibration means 60 alters the gradient energization profiles to compensate for eddy currents. A like calibration circuit 62 and gradient power amplifier 64 are provided for each gradient coil. The altered gradient energization profile, i.e. current pulse, and the induced eddy currents together produce the preselected gradient magnetic field profile. More specifically, the gradient profile generating means 30 generates a preselected gradient energization profile 66 with substantially the same profile as the preselected gradient magnetic field profile. The calibration means 60 produces an altered gradient energization profile 68 which compensates for eddy currents and the like. In this manner, the gradient energization profile 66 and a resultant gradient magnetic field profile are substantially the same.

Because each of the gradient profile calibration circuits 62 are substantially the same, a single one of the circuits is described in detail and the description is applied by analogy to all the gradient profile calibration circuits of the gradient profile means 60. Each gradient profile calibration circuit includes an input 70 on which the gradient energization profile is received. A digitally programmable RC circuit means 72 is connected between the input 70 and an input of a profile amplifier 74. A digitally programmable feedback loop 76 is connected between a calibration circuit output 78 and the profile amplifier input.

The digitally programmable RC circuit means 72 includes a first multiplying digital-to-analog converter 80 connected in parallel with a capacitance means 82. The effective resistance of the multiplying digital-to-analog converter is digitally programmed by the its internal solid state switch array. Thus, the resistance in parallel with the capacitor 82, hence, the RC time constant is adjusted in accordance with the switches which are closed.

The digitally programmable feedback loop 76 feeds back a digitally selectable portion of the gradient energization profile. The digitally programmable feedback loop includes a second multiplying digital-to-analog converter 84 whose reference current input is connected to the calibration circuit output 78. The second multiplying digital-to-analog converter acts as a second digital potentiometer. The selection of solid state switches in its internal array that are closed, e.g. by a binary signal, determines the feedback resistance between the profile amplifier output 78 and the input of profile amplifier 74, hence, the amount of resistance in the feedback loop.

The location of the zero is adjustable and inversely proportional to the effective resistance of the first multiplying digital-to-analog converter 80. The overall gain is determined by the ratio of the effective resistance of the second multiplying digital-to-analog converter 84 to the effective resistance of the first multiplying digital-to-analog converter 80. In this manner, both the zero and the gain may be controlled by adjusting the resistance of the multiplying digital-to-analog converters. To insure that the resistance varies proportionately over the full range of resistances, it is preferred that both multiplying digital-to-analog converters are fabricated on the same monolithic chip. In this manner, the altered gradient energization profile 68 is related to the unaltered gradient energization profile 66 by the relationship:

$$V_{out}(t) = \frac{-R_{84}}{R_{80}} (1 + R_{80}C_{82}t)V_{in}.$$

To provide an initial calibration of the gradient profile calibration means 60, a magnetic field monitor 90 is placed in the image region. The magnetic field monitor measures the resultant gradient magnetic field by sensing the relative magnetic field at a plurality of points across the image region. An iterative adjustment computer means 92 compares each of a plurality of measured magnetic field gradient profiles measured by the magnetic field monitor 90 with a preselected gradient magnetic field profile. The computer means 92 iteratively adjusts the internal switch arrays of the first and second multiplying digital-to-analog converters until conformity between the measured and preselected gradient magnetic field profiles is optimized. Various iterative or other adjustment techniques may be selected, such as a least squares technique, a chi squared technique, or the like.

When a magnetic resonance examination is to be commenced, a central timing computer 94 causes the radio frequency transmitter 20 and the gradient energization profile generating means 30 to generate a preselected sequence of radio frequency and gradient energization profiles such as those illustrated by way of example in FIG. 2.

After application of the magnetic resonance excitation pulse 22, any radio frequency magnetization manipulating pulses 24, and the selected gradient magnetic field profiles 32, 34, 36, a magnetic resonance echo signal 100 is caused. An image reconstruction means D receives a series of the echo signals and processes them into an electronic image representation. The magnetic resonance signal is received by the antenna 26 and conveyed to a radio frequency receiver 102. A two dimensional Fourier transform or other reconstruction algorithm 104 converts the received radio frequency magnetic resonance signal into an electronic image representation which may be stored in an image memory 106 for display on a display means 108, may be stored on tape or disk, or may undergo further processing.

Correcting for the eddy currents is generally only necessary when a gradient magnetic field profile is applied concurrently with the application or receipt of a radio frequency signal. Most gradient magnetic field profiles which are not applied concurrently with a radio frequency signal do not require a gradient energization profile calibration. In many instances, the area under the gradient magnetic field profile rather than the shape of the gradient magnetic field profile is of primary importance. Only non-linearities in the gradient field profile which are occur during a radio frequency transmission or receipt disrupt the linearity of the system.

To reduce the power consumption on the power amplifiers of the gradient profile generating means attributable to the gradient profile calibration means, the central timing computer 94 produces a calibration control pulse sequence 110 for each gradient axis which controls a calibration bypass means 112, including bypass switches 114 and 116 and an inverting amplifier 118. The calibration control pulse sequence and the bypass means enable the calibration means 60 to alter the gradient energization profiles during radio frequency signal transmission and reception. Between radio frequency transmissions and reception, the bypass means enables the gradient energization profiles to pass uncalibrated and unaltered through the bypass means 112 to the gradient power amplifier and the gradient coils.

Figure 3:
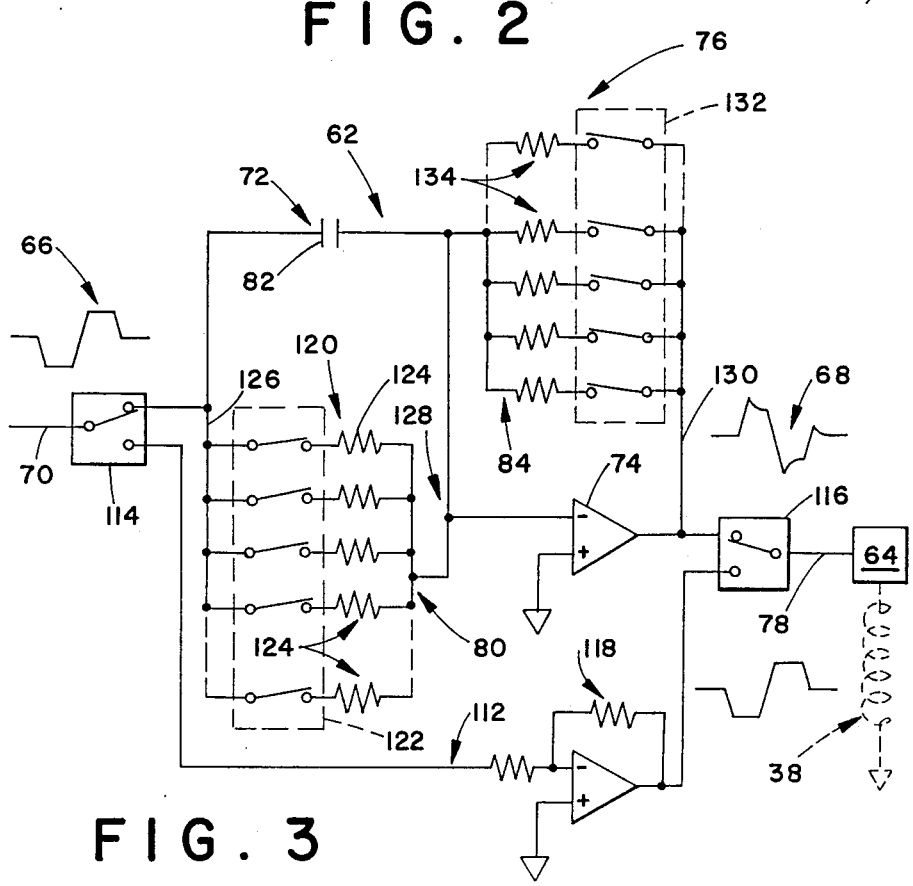

With reference to FIG. 3, the first multiplying digital-to-analog converter 80 includes a digital potentiometer 120. The digital potentiometer includes a plurality of solid state switches 122, such as an array of CMOS transistors which are controlled by a binary or other digital code from the iterative adjustment processor 92. Each of a plurality of resistors 124 is connected in series with one of the solid state switches and in parallel with the other resistors. In this manner, the amount of resistance connected between a reference current input 126 and a summing mode 128 is digitally selected by the solid state switch array. The iterative adjustment processor 92 controls the resistance in parallel with capacitor 82, hence, the RC time constant of the RC circuit means 72.

The second multiplying digital-to-analog converter 84 has a reference input 130 connected to the calibration circuit output 78. A second digital potentiometer includes a digitally controlled switch means 132, such as an array of CMOS transistors which are each connected in series with a resistor of a resistor array 134. The second digital potentiometer is connected with the summing mode 128 at the inverting input of the profile amplifier 74 and with the RC circuit means 72. In this manner, the iterative adjustment processor 92 provides a binary signal to the second digital potentiometer to control the amount of resistance in the feedback path 76.

The invention has been described with reference to the preferred embodiment. Obviously, modifications and alterations will occur to others upon reading and understanding the preceding detailed description. It is intended that the invention be construed as including all such alterations and modifications insofar as they come within the scope of the appended claims or the equivalents thereof.

Having thus described the preferred embodiment, the invention is now claimed to be:

1. A magnetic resonance apparatus comprising:
   a main magnetic field means for generating a substantially uniform main magnetic field through an examination region;
   a gradient energization profile generating means for generating gradient energization profiles each indicative of a preselected gradient field profile;
   a gradient coil means for receiving the gradient energization profiles and generating a corresponding gradient magnetic field profile therewith, the generated gradient magnetic field profile causing eddy currents, which eddy currents generate opposing gradient magnetic field components that distort the generated gradient magnetic field profile, whereby the generated magnetic field profile differs from the preselected gradient field profile;
   a gradient profile calibration means operatively connected between the gradient profile generating means and the gradient coil means for altering the energization profile such that the generated gradient magnetic field profile more closely matches the preselected gradient field profile, the gradient profile calibration means includes a calibration adjusting means for adjusting the calibration means alteration of the energization profile, whereby the calibration means is selectively adjustable;
   a magnetic field monitoring means disposed in the examination region for measuring the generated magnetic field gradient profiles;
   a computer means operatively connected with the magnetic field monitoring means and with the calibration means adjusting for comparing the preselected gradient profile with the measured gradient magnetic field profile and adjusting the adjusting means to optimize conformity between the preselected gradient profile and the measured gradient magnetic field profile, whereby the gradient field profile calibration means is automatically calibrated.

2. The apparatus as set forth in claim 1 wherein the calibration adjusting means includes a digital potentiometer which is directly controlled by the computer means to adjust the calibration means.

3. The apparatus as set forth in claim 1 wherein the gradient profile calibration means includes an energization profile amplifier means and wherein the calibration adjusting means includes a first multiplying digital-to-analog converter means connected between a reference current input for receiving the energization profiles and an input to the energization profile amplifier means to switch different amounts of resistance between the reference current input and the amplifier input, the multiplying digital-to-analog converter means being connected to the computer means to be controlled by digital signals therefrom.

4. The apparatus as set forth in claim 3 further including a capacitor means operatively connected with the first multiplying digital-to-analog converter means such that the first multiplying digital-to-analog converter means and the capacitor means provides an RC time constant which is adjusted by the digital control signals.

5. The apparatus as set forth in claim 4 further a second multiplying digital-to-analog converter means which has a reference current input operatively connected with an output of the profile amplifier means and an putput connected with the profile amplifier input, the second multiplying digital-to-converter means being connected to the computer means to be controlled by digital signals therefrom.

6. The apparatus as set forth in claim 1 further including:
   an RF signal means for intermittently transmitting radio frequency signals into the examination region and receiving radio frequency signals therefrom;
   a calibration bypass means for selectively switching the calibration means into and out of communication between the gradient profile generating means and the gradient coil means, whereby energization profiles are selectively conveyed directly from the profile generating means to the gradient coil means with and without adjustment by calibration means; and,
   a calibration bypass control means for switching the calibration means into communication between the profile generating means and the gradient coil means when radio frequency signals are being transmitted and when radio frequency signals are being received and for switching the calibration means out of communication between the profile generating means and the gradient coil means when radio frequency signals are neither being transmitted nor received.

7. The apparatus as set forth in claim 6 further including a Fourier transform means for reconstructing an image from the received radio frequency signals.

8. The apparatus as set forth in claim 1 wherein the calibration means includes an energization profile amplifier means and a feedback path, the calibration adjusting means including a digital-to-analog converter means disposed in the feedback path, the digital-to-analog converter means including a reference current input operatively connected with an output of the energization profile amplifier and an array of resistors and solid state switches which are connected between the reference current input and an input of the energization profile amplifier, the solid state switches being operable to switch different amounts of resistance between the reference current input and the energization pulse amplifier input, the solid state switches being connected to the computer means to be controlled by digital signals therefrom.

9. A magnetic resonance imaging apparatus comprising:
a main magnetic field means for generating a substantially uniform magnetic field through an examination region;
an energization profile generating means for generating gradient energization profiles each of which corresponds to a selected gradient magnetic field profile;
a gradient coil means for receiving the gradient energization profile and generating therewith a corresponding gradient magnetic field profile in the examination region, the gradient magnetic field profile inducing eddy currents which in turn generate additional gradient magnetic field components that distort the generated gradient magnetic field profile;
a calibration means operatively connected between the profile generating means and the gradient coil means for altering the gradient energization profile to compensate for the distortion in the generated gradient magnetic field profile;
a calibration bypass means for selectively disabling the gradient profile calibration means and causing gradient energization profiles to pass from the profile generating means and the gradient coil means without being altered by the calibration means;
a radio frequency means for transmitting radio frequency signals into the examination region and receiving radio frequency signals from the examination region;
a calibration bypass control means for selectively controlling the calibration bypass means to enable the calibration means to alter the energization profiles when radio frequency signals are being transmitted and when radio frequency signals are being received.

10. The apparatus as set forth in claim 9 wherein the calibration means includes a digital potentiometer which is directly controlled by a computer means to adjust the calibration alterations to the energization profiles.

11. The apparatus as set forth in claim 9 wherein the calibration means includes a multiplying digital-to-analog converter connected with the profile generating means and the gradient coil means for connecting a selectable amount of resistance therebetween.

12. A magnetic resonance imaging apparatus comprising:
a main magnetic field means for generating a substantially uniform main magnetic field in an examination region;
an energization profile generating means for generating gradient energization profiles each of which corresponds to a selected magnetic field gradient profile;
a gradient coil means for transforming the gradient energization profile into a corresponding gradient magnetic field profile in the examination region, the gradient field profile causing eddy currents that distort the generated gradient magnetic field profile;
an energization profile amplifier means operatively connected between the profile generating means and the gradient coil means;
a first array of digitally controlled switches, each digitally controlled switch being operatively connected with a resistor of a first resistor array such that the first digitally controlled switches adjust the resistance;
the first resistor and switch array being operatively connected between the profile generating means and an input of the energization profile amplifier means;
a second array of digitally controlled switches each operatively connected with a resistor of a second resistor array, the second resistor and digital switch array being operatively connected between an output of the energization profile amplifier means and the input of the energization profile amplifier means to provide a digitally controlled feedback path; and,
the first resistor and switch arrays being operatively connected between the profile generating means and an input of the energization profile amplifier means;
a capacitor means operatively connected with the first resistor array and the enegization profile amplifier input such that the first digital switch array adjusts an RC time constant.

13. The apparatus as set forth in claim 12 wherein the first and second resistor arrays and first and second switch arrays are subcomponents of a monolithic digital-to-analog converter pair.

14. A method of magnetic resonance apparatus calibration comprising:
generating current pulses, each of which has a profile that corresponds to a preselected gradient magnetic field profile;
applying the current pulses to a gradient field coil to generate a resultant gradient magnetic field profiles, the resultant gradient magnetic field profiles causing eddy currents that cause distortion in the resultant gradient magnetic field profiles relative to the preselected gradient magnetic field profile;
measuring the resultant gradient magnetic field profiles;
with a digital computer, comparing each measured gradient magnetic field profile with the preselected gradient field profile and altering the current pulses in response to the comparison until conformity between the measured and preselected gradient field profiles is optimized.

15. The method as set forth in claim 14 wherein the step of altering the current pulses includes operating on a portion of the current pulse with a first resistive means, a second resistive means and a capacitor to create an altered current pulse with an RC time constant determined by the capacitive means and the first resistive means and an amplitude determined by the second resistive means.

16. The method as set forth in claim 15 wherein the first and second resistive means are digital-to-analog converters which are directly controlled by a digital output of the computer.

17. A method of magnetic resonance imaging, the method comprising:

generating a generally uniform magnetic field in an image region;

generating a series of gradient energization profiles, each of which corresponds to a gradient magnetic field profile to be applied on the substantially uniform magnetic field in the image region;

intermittently transmitting radio frequency signal pulses into the image region to excite magnetic resonance in a subject disposed therein;

intermittently receiving radio frequency signals attributable to excited magnetic resonance in the image region;

reconstructing an image representation from the received radio frequency signals;

altering the gradient energization profiles that are applied concurrently with the radio frequency transmissions and which are applied concurrently with the radio frequency reception, the gradient energization profiles being altered to correct for eddy current distortion; and, between the radio frequency transmitting and receiving steps, converting the gradient energization profiles unaltered into the corresponding gradient magnetic field profiles whereby eddy current correction is provided during radio frequency signal transmission and receipt.

18. The method as set forth in claim 17 wherein the step of altering the gradient energization profile includes operating on a portion of the gradient energization profile with a first resistive means, a second resistive means, and a capacitor.

19. The method as set forth in claim 17 wherein the step of altering the gradient energization profile includes operating on at least a portion of the gradient energization profile with a capacitive circuit and multiplying digital-to-analog converters which are directly controlled by a digital output of a computer.

* * * * *